(12) United States Patent
Guo et al.

(10) Patent No.: US 6,778,315 B2
(45) Date of Patent: Aug. 17, 2004

(54) MICRO MIRROR STRUCTURE WITH FLAT REFLECTIVE COATING

(75) Inventors: Shuwen Guo, Lakeville, MN (US); Ross Hoffman, Burnsville, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

(21) Appl. No.: 10/254,318

(22) Filed: Sep. 25, 2002

(65) Prior Publication Data

US 2004/0057102 A1 Mar. 25, 2004

(51) Int. Cl.[7] .............................................. G02B 26/00
(52) U.S. Cl. ......................... 359/290; 359/291; 359/627
(58) Field of Search .............................. 359/290–1, 627, 359/618, 584, 838, 883, 887, 872, 868, 850, 855, 858, 291; 385/16–19

(56) References Cited

U.S. PATENT DOCUMENTS

| | | | |
|---|---|---|---|
| 6,450,654 B1 | 9/2002 | Koester | 359/872 |
| 6,522,801 B1 * | 2/2003 | Aksyuk et al. | 385/18 |
| 6,530,668 B2 * | 3/2003 | Krisko | 359/883 |
| 6,605,339 B1 * | 8/2003 | Marshall et al. | 428/220 |
| 6,618,184 B2 * | 9/2003 | Jin et al. | 359/291 |
| 6,633,693 B1 * | 10/2003 | Peale et al. | 385/18 |
| 2001/0030817 A1 | 10/2001 | Hagelin et al. | 359/874 |
| 2002/0181110 A1 * | 12/2002 | Bower et al. | 359/599 |

OTHER PUBLICATIONS

Gessner, T. et al., "*Micromirrors and micromirror arrays for scanning applications,*" Proceedings of SPIE, vol. 4178, pp. 338–347 (2000).

Kehr, K. et al., "Investigation of Heat Transfer in Micromirrors," Part of the EUROPTO Conference on Microsystems Metrology and Inspection, Munich, Germany, SPIE vol. 3825, pp. 24–33 (Jun. 1999).

Su, Gg, et al., "Sufrace–Micromachined 2–D Optical Scanners with High–Performance Single–Crystalline Silicon Micromirrors," *IEEE Photonics Technology Letters*, vol. 13, No. 6, pp. 606–608 (Jun. 2001).

Srinvisan, U. et al., "Fluidic Self–Assembly of Micromirrors onto Surface Micromachined Acutators," *IEEE*, pp. 59–60 (2000).

Cao, K. et al., "Curvature Compensation in Micromirrors With High–Reflectivity Optical Coatings," *Journal of Microelectromechanical Systems*, vol. 10, No. 3, pp. 409–417 (Sep. 2001).

Seunarine, K. et al., "Techniques to improve the flatness of reflective micro–optical arrays," *Sensors and Actuators*, 78, pp. 18–27 (1999).

(List continued on next page.)

*Primary Examiner*—Jordan M Schwartz
*Assistant Examiner*—Jessica Stultz
(74) *Attorney, Agent, or Firm*—Thompson Hine LLP

(57) ABSTRACT

A micro mirror structure including a plurality of individually movable mirrors. Each mirror has a generally concave shape from a top perspective at a temperature of about 20 degrees Celsius and has a generally convex shape from a top perspective at a temperature of about 85 degrees Celsius. In one embodiment, the radius of curvature may be greater than about 500 mm at a temperature of about 20 degrees Celsius and may be less than about –600 mm at a temperature of about 85 degrees Celsius at a thickness of about 10 microns. In another embodiment, the invention is a micro mirror structure including a plurality of individually movable mirrors arranged in an array. Each mirror includes a substrate, a diffusion barrier layer located above the substrate, and a reflective layer located above the diffusion barrier layer. The diffusion barrier layer generally limits the diffusion of the top reflective layer through the diffusion barrier layer.

17 Claims, 5 Drawing Sheets

OTHER PUBLICATIONS

Akimoto, K. et al., "Evaluation of Comb–Drive Nichel Micromirror for Fiber Optical Communication," *IEEE Tenth Annual International Workshop on Micro Electro Mechanical Systems*, pp. 66–71 (Jan. 1997).

Underwood, I et al., "Array of high quality surface micromirrors by chemical mechanical polishing of dielectric and metal," *IEEE/LEOS Summer Topical Meeting Digest*, pp. 15–16 (Jul. 1998).

Kim, S. et al., "Thin–film Micromirror Array (TMA) for High Luminance and Cost–Competitive Information Display Systems," *SPIE*, vol. 3634, pp. 207–215 (Jan. 1999).

Bartek, M. et al., "Silver–based reflective coatings for micromachined optical filters," *J. Micromech. Microeng.*, 9, pp. 162–165 (1999).

Nee, J. et al., "Lighweight, Optically Flat Micromirrors for Fast Beam Steering," *IEEE/LEOS Optical MEMS 2000 Conference* (Aug. 2000).

"2–D MEMS scanner features single–crystalline silicon micromirrors," website: www.photonicsonline.com Editor's Report (Jun. 2000).

Vdovin, G., "Micromachined adaptive mirrors" (Dec. 1996).

Mansell, J. et al., "Micromachined Silicon Deformable Mirror," *SPIE Adaptive Optical System Technologies*, SPIE Proceedings vol. 3353 (Apr. 1998).

Conant, R. et al., "A Flat High–Frequency Scanning Micromirror," *Solid–State Sensor and Actuator Workshop*, pp. 6–9 (Jun. 2000).

\* cited by examiner

MICRO MIRROR STRUCTURE WITH FLAT REFLECTIVE COATING

The present invention is directed to a micro mirror structure, and more particularly, to a micro mirror structure with high reflectivity and flatness.

BACKGROUND

Micro mirror structures, such as micro mirror arrays, are typically used in an optical cross connect engines or other devices or applications to reflect and route optical signals. A mirror array may include a plurality of individually movable mirrors or reflective surfaces which can reflect and redirect an incoming signal in a desired direction. Each individual mirror in the mirror array may include a substrate and a thin metal film located on the substrate to enhance the reflectivity of the mirror. Each mirror is preferably relatively thin so that: 1) the mirror has a high resonant frequency that is outside of environmental vibration frequencies; 2) the mirror is light and can react quickly to actuation forces to achieve large deflection angles; and 3) the mirror is about the same thickness as the springs, which allows easy processing.

Each mirror should have high flatness and high reflectivity to ensure signals reflected by the mirror are accurately directed with a minimum loss of the strength of the signal. However, when a reflective metal is located on a substrate, the reflective metal may diffuse through to the substrate, particularly when exposed to elevated temperatures, which can reduce the reflectivity of the mirror and the mirror's long-term stability.

Furthermore, internal stresses in the substrate and/or metal film may induce a curvature in the mirrors, which can cause focal aberrations and astigmatisms. Processing and manufacturing of the mirror array, such as reactive ion etching processes or sputtering with use of a shadow mask, can induce further curvature in the mirrors. Furthermore, the thermal coefficient of expansion of the metal film may differ from the thermal coefficient of expansion of the substrate. Accordingly, when the ambient temperature of the mirror array increases, such as during operation of an optical cross-connect engine, the curvature in each mirror may increase due to the differing thermal coefficients of thermal expansion between adjacent materials or layers.

SUMMARY

In one embodiment, the present invention is a mirror structure which has a substrate and reflective coating located thereon. The mirror structure is concave at a predetermined temperature and convex at another predetermined temperature such that the mirror structure can be maintained within a range of flatness over a range of temperatures. In one embodiment, a corrective layer is located above the substrate, the corrective layer being in a state of tension, and a top reflective layer is located above the corrective layer. The corrective layer may act as a diffusion barrier as well as providing stress balance to the metal film. In another embodiment, the mirror structure includes a diffusion barrier located between the substrate and the reflective layer.

In one embodiment, the invention is a micro mirror structure including a plurality of individually movable mirrors. Each mirror has a generally concave shape at a temperature of about 20 degrees Celsius and has a generally convex shape at a temperature of about 85 degrees Celsius. In another embodiment, the invention is a micro mirror structure including a plurality of individually movable mirrors arranged in an array. Each mirror may have a substrate, a corrective layer located above the substrate, the corrective layer being in tension, and a top reflective layer located above the corrective layer.

Other objects and advantages of the present invention will be apparent from the following description and the accompanying drawings.

DETAILED DESCRIPTION

Figure 1:
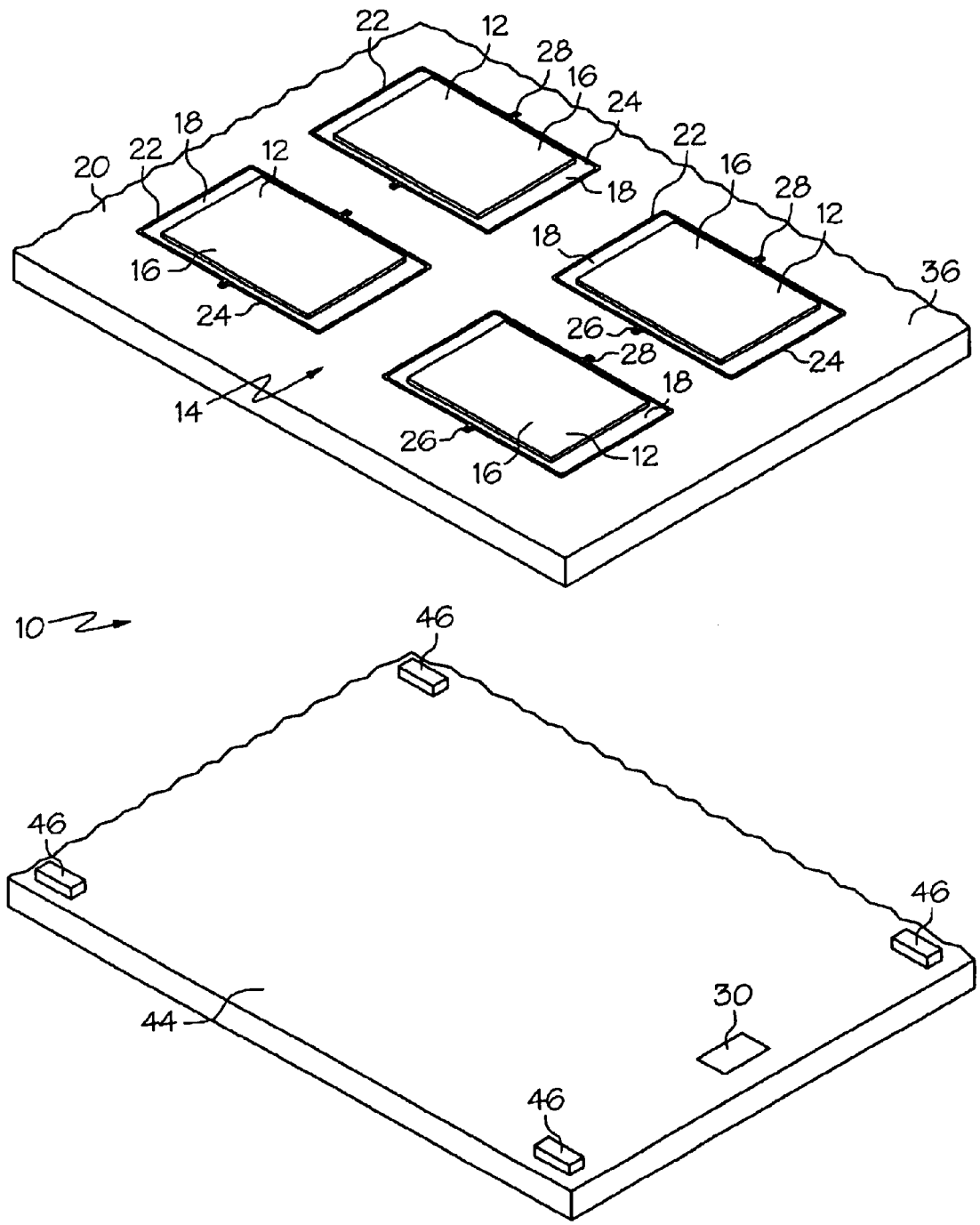
FIG. 1 is a top perspective view of a portion of an array of micro mirrors.
Figure 2:
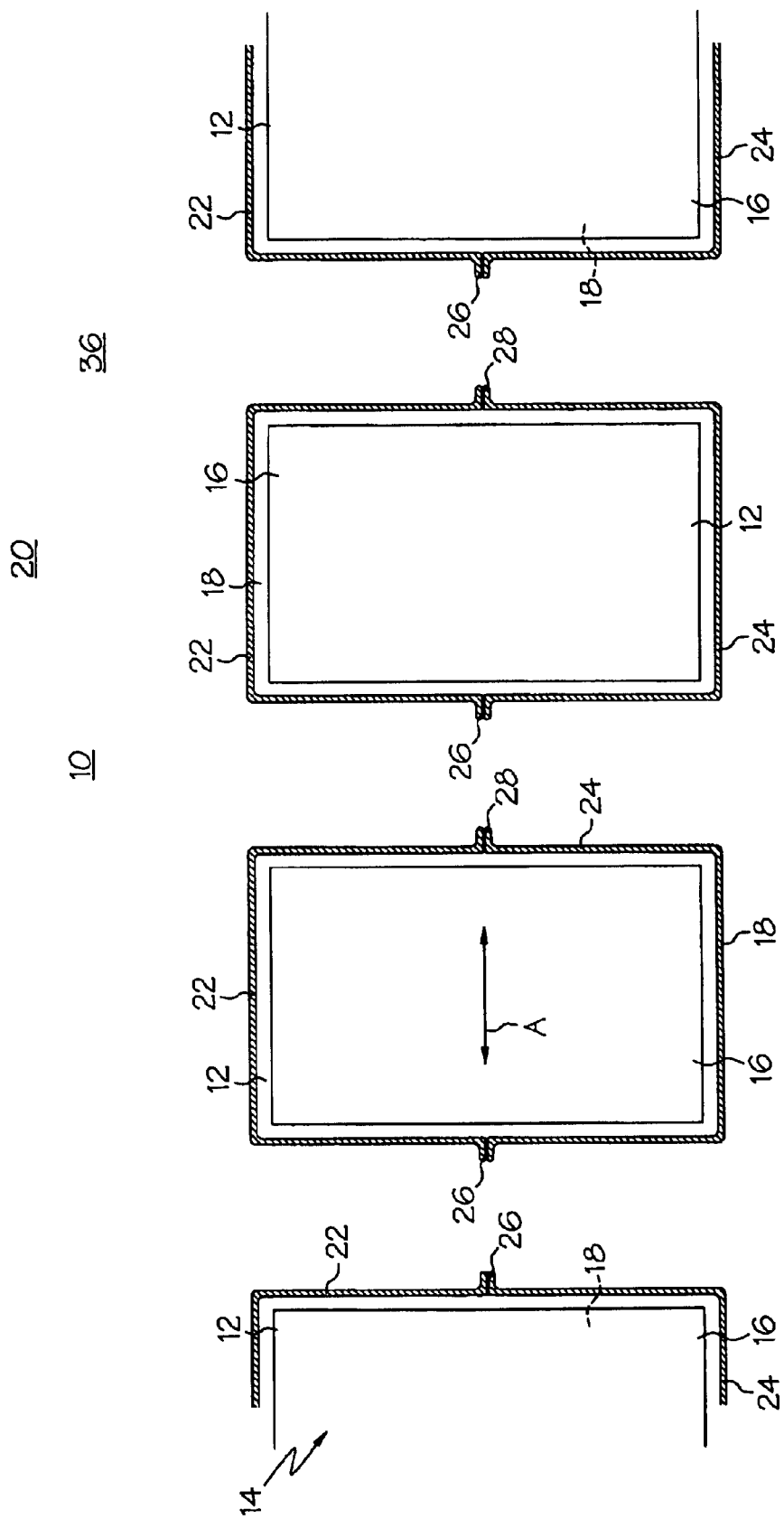
FIG. 2 is a top view of a row of micro mirrors of an array of micro mirrors.

As best shown in FIGS. 1 and 2, in one embodiment a mirror structure 10 includes a plurality of movable mirrors 12 formed in an array, generally designated 14. It should be understood that while in one embodiment the array is a generally rectangular array including a plurality of columns and rows of mirrors, the term "array" as used herein is not limited to a rectangular array including rows and columns, but includes any arrangement of mirrors in any manner or pattern.

Each mirror 12 may include a metal film 16 located on top of a substrate 18. Each of the mirrors 12 may be relatively small (i.e., in one embodiment on the order of about 375 microns×400 microns or about 475 microns×555 microns), and the array 14 can include nearly any desired number of mirrors (i.e., in one embodiment about 500 mirrors).

Each individual substrate 18 may be located on or formed as part of an upper wafer or support 20, and each individual substrate 18 may be defined by a set of cut outs 22, 24 formed in, and extending through the thickness of, the upper wafer 20. As shown in FIG. 2, each cut out 22, 24 may extend around about one-half of the perimeter of the substrate 18. The cut outs 22, 24 may be slightly spaced apart from each other to define a pair of narrow arms or springs 26, 28 located between each of the cut outs 22, 24 and on opposite sides of the associated substrate 18. In this manner, each substrate and associated reflective layer may be able to rotate at least about an axis A (see FIG. 2) defined by the arms 26, 28. Each mirror 12 may be rotated around its axis A by any of a variety of manners, including through the use of controlled electromagnetic forces.

Figure 3:
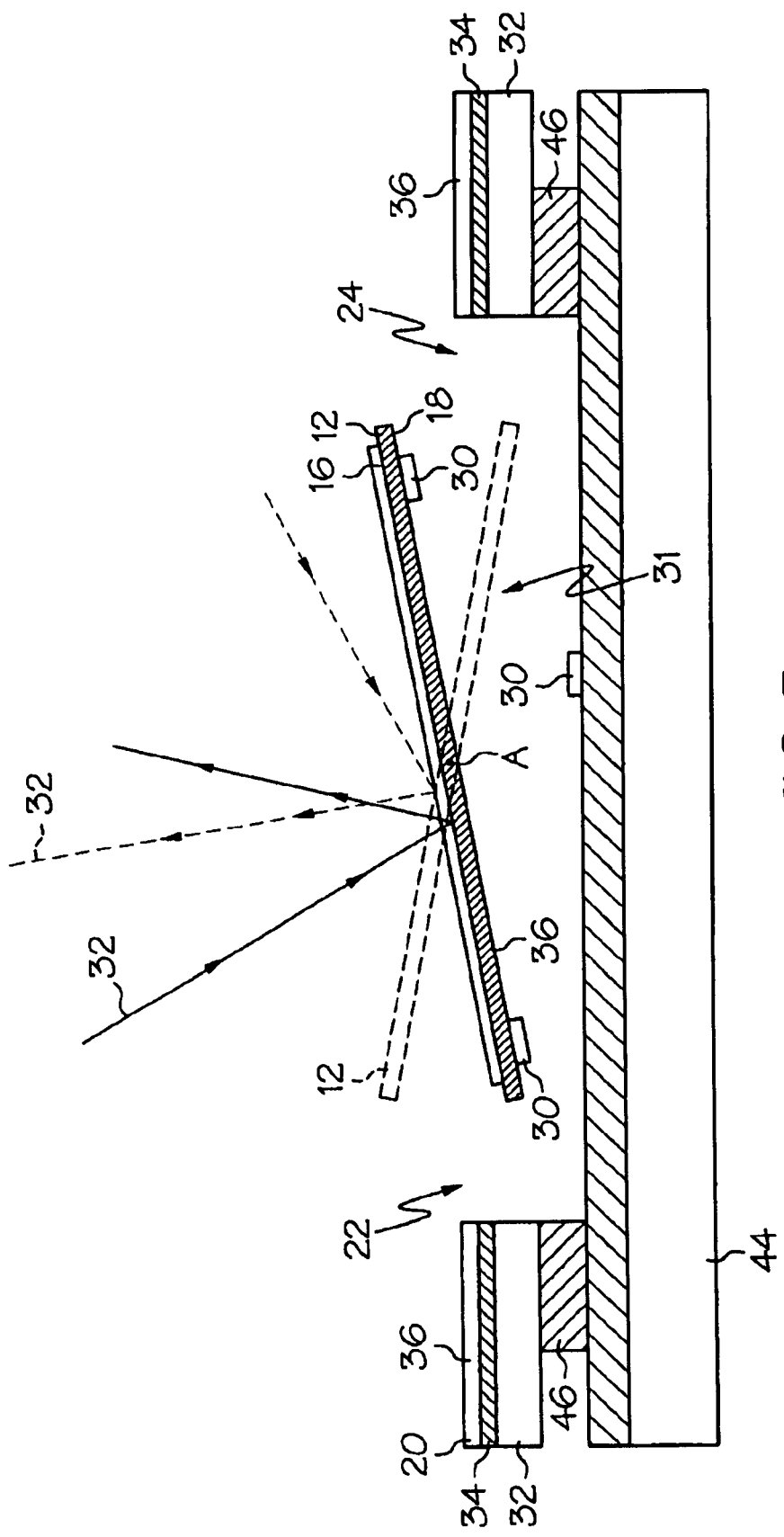
FIG. 3 is a side cross section of one of the mirrors of FIG. 1 or 2.

As shown in FIG. 3, the mirror structure 10 may include control electronics (generally designated 30) which can be located on and/or adjacent to and/or below each mirror 12 to control the application and magnitude of the electromagnetic forces applied to each mirror 12. In this manner, the control electronics 30 can be operated to individually rotate to move each mirror 12 into the desired configuration to reflect light signals 32 in the desired manner (see, e.g. FIG. 3 which illustrates, in hidden lines, the mirror 12 in an alternate rotational position).

As shown in FIG. 3, the upper wafer 20 may be a silicon-on-insulator wafer which includes a lower layer 32 (such as silicon), an upper layer 36 (such as silicon), and an insulating layer 34 (such as silicon dioxide) located between the upper 36 and lower 32 silicon layers. In this case, each individual substrate 18 may be formed out of the upper layer 36, and may be defined by creating the cut outs 22, 24 in the upper layer 36. However, the upper wafer 20 and/or upper layer 36 and/or substrates 18 can be made from a wide variety of other materials and methods without departing from the scope of the present invention. The upper wafer 20 and/or upper layer 36 and/or substrates 18 can be made of nearly any material (preferably a machinable material such as GaAs or InP). The upper wafer 20 can be made from two or more wafer joined together to form the upper wafer 20.

The upper wafer 20 may be coupled to a lower wafer 44 that is located below the upper wafer 20. A spacer or spacers 46 may be located between the upper wafer 20 and lower wafer 44, or the upper wafer 20 may be directly coupled to the lower wafer 44. The lower wafer 44 may be a silicon-on-insulator wafer, or can be made of a variety of semiconducting or other materials, and may include the control electronics 30 thereon.

Figure 4:
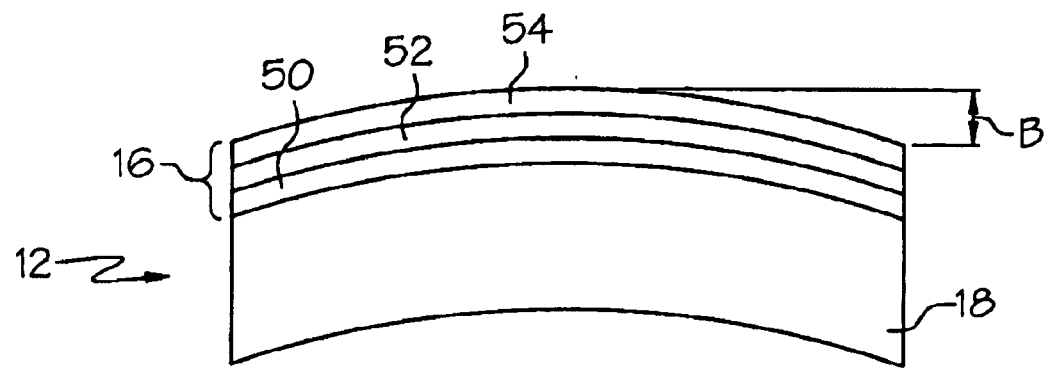
FIG. 4 is a cross section of a mirror in a convex state.
Figure 5:
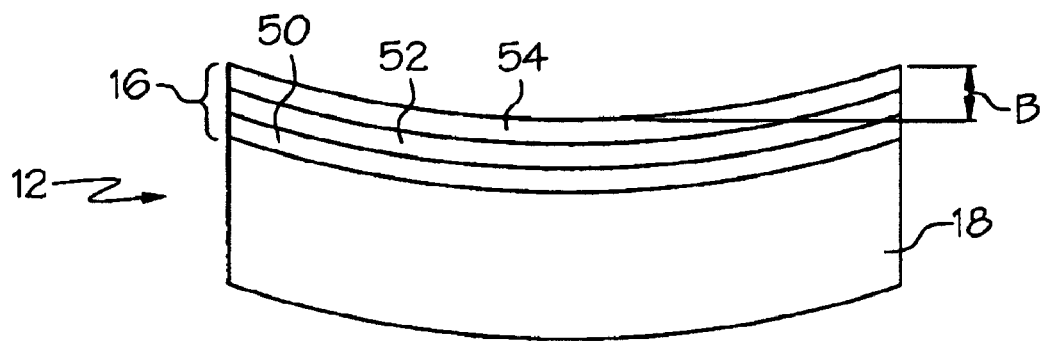
FIG. 5 is a cross section of mirror in a concave state.

As shown in FIGS. 4 and 5, the metal film 16 may include various layers. For example, in the illustrated embodiment the metal film 16 includes an adhesion layer 50 located on the substrate 18, a corrective layer 52 located on the adhesion layer 50, and a top reflective layer 54 located on the corrective layer 52. The reflective layer 54 can be made of any material that reflects light or other signals desired to be transmitted (typically infrared light) in the desired manner. For example, the reflective layer 54 may be metal such as gold, aluminum, silver, etc. The reflective layer 54 may have good reflectivity over the infrared range of electromagnetic energy, such as at about 1.55 microns.

The mirrors 20 may be exposed to high temperatures during subsequent manufacturing steps, such as during flip-chip bonding. Long term operation at elevated temperatures can also induce diffusion of the reflective layer. Thus, it may be desired to anneal the metal film to increase its mechanical stability. However, when gold or other similar materials are used as the reflective layer 54, it may be difficult or impractical to deposit the reflective layer 54 directly onto the substrate 18, particularly when the substrate 18 is silicon or another semiconducting material. In particular, under elevated temperatures, which can arise during subsequent processing of the micro mirror array (i.e. during annealing or flip-chip bonding), the reflective layer 54 can diffuse into the substrate 18. If the reflective layer 54 is allowed to diffuse into the substrate 18, the reflectivity of the reflective layer 54 may be reduced and the mechanical properties of the substrate 18 and reflective layer 54 may become unpredictable and/or unstable.

Thus, a diffusion barrier may be located between the reflective layer 54 and the substrate 18 to block or limit diffusion of the reflective layer. Although a separate diffusion barrier layer may be used, in one embodiment at least one of the adhesion layer 50 or corrective layer 52 have diffusion blocking properties, and therefore serves as the diffusion blocking layer or diffusion barrier. In one embodiment, the corrective layer 52 serves as the diffusion barrier. Thus, during any subsequent annealing of the metal film 16 and exposure of the reflective layer 54 to high temperatures, the corrective layer 52 prevents significant diffusion of the reflective layer 54.

Due to the differing types of materials (i.e. metal vs. silicon) it may also be difficult to deposit the metal film 16 onto the substrate 18. The adhesion layer 50 preferably helps to ensure that the metal film 16 (i.e. in particular the reflective layer 54 and corrective layer 52) adheres to the substrate 18. Because the substrate 18 may be a semiconducting material, such as silicon, the adhesion layer 50 may be made of a material that adheres or bonds well to both metals and semiconducting materials, for example, after an annealing process. Any of a wide variety of materials may be used for the adhesion layer 50, including but not limited to titanium and chromium. The adhesion layer 50 may be in a state of compression under normal operating conditions.

Figure 6:
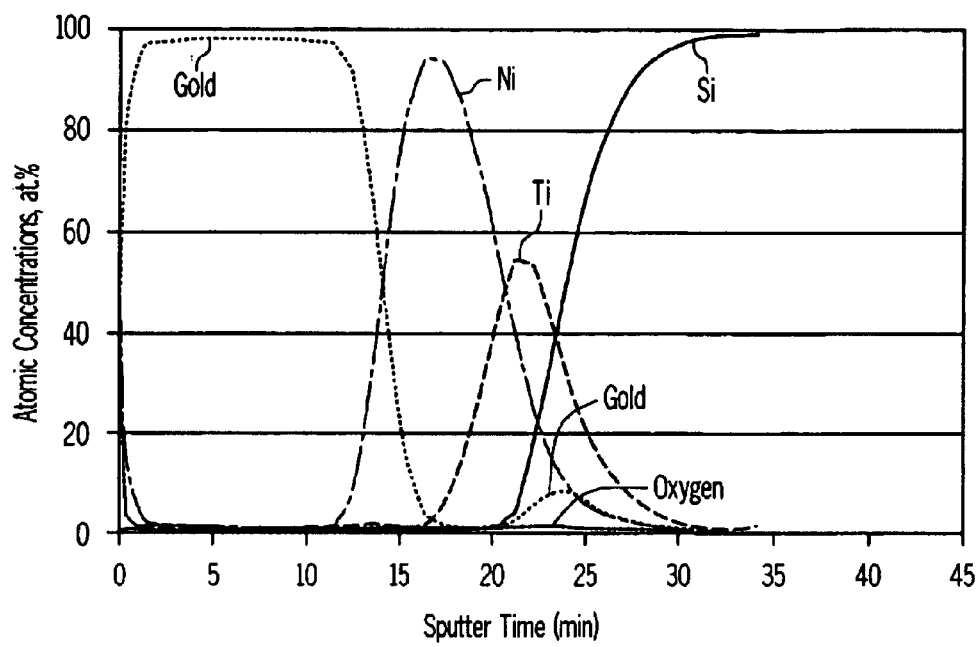
FIG. 6 illustrates an XPS profile of a sample mirror.

FIG. 6 illustrates an XPS (x-ray photoelectron spectrum) profile of a sample mirror 12 of the present invention. The profile of FIG. 6 illustrates a mirror having a silicon substrate 18 with a thickness of about 9.5 microns, a gold reflective layer 54 with a deposited thickness of about 600–700 angstroms, a nickel connective layer 52 with a deposited thickness of about 150–180 angstroms, and a titanium adhesion layer 50 with a deposited thickness of about 200–250 angstroms after the mirror 12 is annealed at a temperature of about 250° C. for 15 hours. The plot of FIG. 6 illustrates that, after annealing, the concentration of gold (the reflective layer 54 in this embodiment), Ni (the corrective layer 52 in this embodiment), Ti (the adhesion layer 50 in this embodiment), Si (the substrate 18 in this embodiment) and oxygen (a trace element included in the film 16) as a function of sputter time. The plot of FIG. 6 thus represents the concentration of the various layers 54, 52, 50 and 18 as a function of thickness (that is the horizontal axis of FIG. 6 can be considered to represent the thickness of the annealed mirror 12 in the vertical direction of FIG. 5).

Thus, FIG. 6 illustrates that the gold layer 54 resists diffusion, even after prolonged exposure to high temperature. In particular, it can be seen that the concentration of gold drops of sharply when nickel appears on the chart, and the concentration of gold is nearly zero beyond the layer of nickel (i.e., to the right of the nickel peak). Although a slight amount of gold is present outside of the diffusion barrier (i.e. at a position of about 23 minutes along the horizontal axis), this concentration of gold outside of the gold layer 54 may have an atomic concentration of no more than about 10%. Thus, it can be seen that the diffusion barrier (which in this case is the corrective layer 52) prevents significant diffusion of the reflective layer 54, which helps to maintain high reflectivity and flatness of the film 16.

It has been found that the reflectivity of the metal film 16 (and more particularly, the reflective layer 54) can be at least about 97% after baking at about 250° C. for up to five hours. Furthermore, the reflective layer 54 can therefore also withstand relatively high temperatures during further processing of an optical cross connect engine, such as soldering reflow, epoxy cure etc.

After annealing, the corrective layer 52 may be in a state of tension during normal operating conditions (i.e., between about 20° C. and about 85° C.). Because the reflective layer 54 and/or substrate 18 and/or adhesion layer 50 typically form a convex shape in top view in the absence of any correcting forces, the tensile nature of the corrective layer 52 tends to correct or counteract the natural convex curvature of the substrate 18, adhesion layer 50 and/or reflective layer 54. Thus, for example, in one embodiment, the corrective layer 52 is selected of a material and deposited in appropriate thickness such that the corrective layer 52 overcomes the bending/compressive forces in the substrate 18 and/or adhesion layer 50 and/or reflective layer 54 such that the mirror 12 has a concave shape at room temperature (i.e., about 20° C.). Thus, in this case, the corrective layer 52 can be made of any of a wide variety of materials, including but not limited to nickel (Ni), nickel chromium (Ni—Cr), tungsten (W), tantalum (Ta), or any material which is in tension at a temperature over the temperature range of interest. If a material exhibits both adhesive and corrective (i.e., tensile) properties, that material may be used as both the adhesion and corrective layer.

FIG. 5 illustrates a mirror 12 at room temperature. In this condition the corrective layer 52 has sufficient tensile stresses to overcome the compressive stresses in the remaining structure of the mirror 12. The tensile forces of the corrective layer 52 are preferably of about the same order of magnitude of the compression forces of the other portions of the mirror 12. In one embodiment, at room temperature the tensile stress of the corrective layer 52 is between about 900 Mpa and about 1200 Mpa. The combined compressive stresses of the adhesion layer 50 and reflective layer 54 may be between about −40 Mpa and about −60 Mpa. The final stress of the combined layers of the adhesion layer 50, corrective layer 52 and reflective layer 54 may be between about 5 and about 60 Mpa in tension, which may lead to a radius of curvature of between about 0.5 m and about 2.0 m in concave.

The corrective layer 52 is preferably deposited at a thickness sufficient to at least somewhat counteract the compression forces of the other portions in the mirror 12. Thus, the desired thickness of corrective layer 52 will depend upon the thicknesses of the other portions/layers of the metal layer 16 and substrate 18, and/or the inherent stresses of such portions/layers. The corrective layer 52 may also be deposited at a thickness sufficient to limit significant bending of the mirrors 12 over the temperature range of interest.

It may be desired that the reflective layer 54 be as thin as possible in order to minimize thermal stresses and bending forces in the mirror 12. On the other hand, the reflective layer 54 should be sufficiently thick to provide the desired reflectivity. Thus, the thickness of the adhesion layer 50 and corrective layer 52 may be determined after the thickness of the reflective layer 54 is set. Thus, with appropriate thickness control, a generally stress balanced metal film 16 can be formed.

As shown in FIG. 5, at room temperature the mirror 12 may have a generally concave shape from a top perspective due to the dominating tensile forces of the corrective layer 52. As the ambient temperature is raised, for example, due to use of an optical cross connect engine and/or heating of adjacent electronic component, the difference in coefficient of thermal expansion between the metal film 16 and the substrate 18 causes the metal film 16 to expand at a higher rate than the substrate 18. Due to the relative similarity of the coefficient of thermal expansions of the adhesion layer 50, corrective layer 52 and reflective layer 54 (each of which may be metals), as compared to the coefficient of thermal expansion of the substrate 18 (which may be a semiconductor), the metal film 16 may be considered to expand or contract as a single unitary film.

Because the coefficient of thermal expansion of silicon or other semiconductors is generally less than that of metals, as the ambient temperature rises, the metal film 16 will expand faster than the substrate 18, and the concavity of the mirror of FIG. 5 will decrease and the tension in the corrective layer 52 will tend to decrease. Thus, with increasing temperature the mirror 12 will eventually reach a transition point where the overall stresses in the mirror 12 balance and the mirror 12 is generally flat. As the temperature increases, the overall stresses in the mirror become compressive and the mirror 12 assumes a generally convex shape (FIG. 4) and the convexity will increase with increasing temperature.

In one embodiment, the mirror 12 transitions from a concave to a convex shape at a temperature between about 50° C. and about 65° C. which may be about the midpoint of the range of expected operating temperatures. However, the transition point may not be critical, and it may be simply desired to have each mirror 12 assume a concave shape at a temperature of about 20° C. and below and a convex shape at a temperature of about 85° C. and above.

Thus, by having the mirror 12 transition from a concave to a convex shape over the expected operating temperatures of the mirror structure 10, the flatness and radius of curvature of each mirror 12 remains relatively small over the desired operating temperatures. In other words, by starting with a concave shape and allowing the mirror 12 to transition to a convex shape, the mirror flatness can remain within desired limits.

Figure 7:
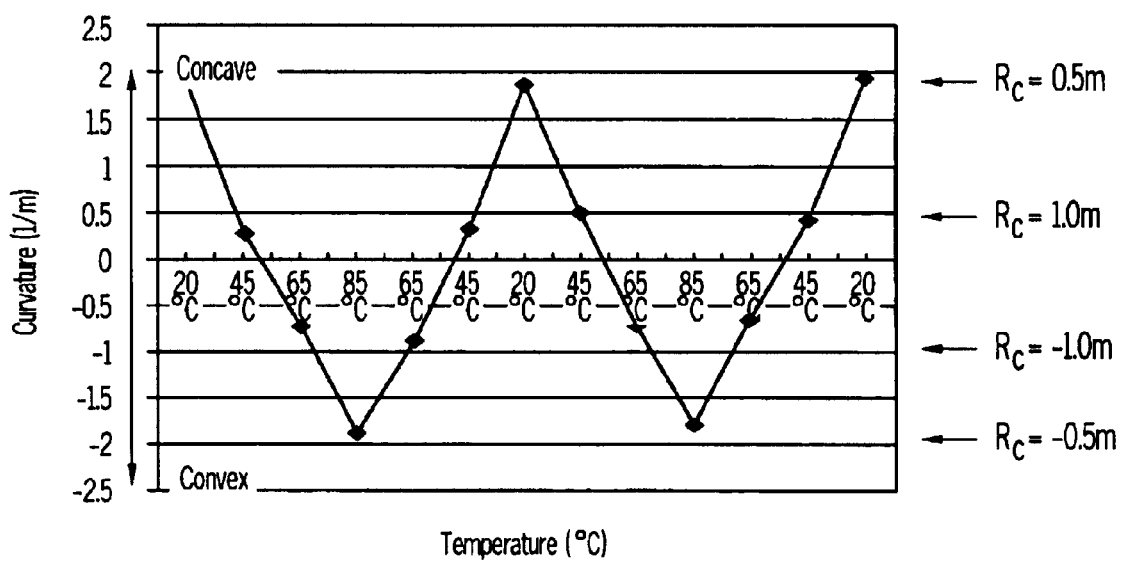
FIG. 7 is a plot of curvature vs. temperature for a given mirror.

FIG. 7 illustrates a sample plot of curvature vs. temperature for a given mirror 12 having an overall thickness of 9.89 microns. From the plot of FIG. 7 it can be seen that the curvature and radius of curvature varies with temperature, and in the illustrated embodiment transitions from a concave to a convex shape at a temperature of about 45–65° C. The radius of curvature can be measured by placing the mirror structure 10 on a temperature-controlled or "hot" chuck under an interferometric contour mapping microscope (such as a WYKO NT2000 microscope).

The radius of curvature in the sample mirror of FIG. 7, which includes a nickel corrective layer, changed less than about 20% after 130 days. In contrast, the radius of curvature of the same mirror structure without a nickle corrective layer changed more than about 60% after 130 days, which illustrates that the corrective layer 52 significantly aids in the long term stability of mirror flatness. In particular, the tensile forces of the corrective layer 52 help to prevent deformation. Furthermore, the diffusion blocking properties of the corrective layer 52 prevent the reflective layer 54 from diffusing therethrough, which helps to maintain stable mechanical properties in the film 16. In particular, if the reflective layer 54, such as gold, diffuses through the corrective layer 52, the thickness of the gold layer 54 (which may be in tension after annealing) may be decreased which can contribute to increased curvature. Furthermore, the diffused gold may form gold alloys with other materials of the metal film 16, which can provide for additional undesired compressive/ tensile forces and therefore curvature. Thus, both the tensile forces and the diffusion-blocking properties of the corrective layer 52 help to improve the long-term flatness of the mirrors 12.

When the reflective layer 54 is made of a soft metal, such as gold, the reflective layer 54 may be unstable under temperature changes. Thus, the use of the adhesion layer 50 and corrective layer 52, both of which may have a significantly higher elastic modulus and yield stress than gold, enables the stress of the metal film 16 to be dominated by the adhesion layer 50 and corrective layer 52. In this manner, the composite film 16 is more stable and less susceptible to temperature induced drift and time relaxation induced drift.

Although the mirror structure 10 may be formed by a wide variety of methods without departing from the scope of the present invention, and a variety of different thicknesses and dimensions may be used, in one embodiment the substrate 18 is silicon having a thickness of between about 9.2 and about 10.5 microns. The adhesion layer 50 may be titanium having a thickness of between about 50 to 450 angstroms, preferably about 300 angstroms. The corrective layer 52 may be nickel having a thickness of between 50 and about 250 angstroms, preferably about 85 angstroms. Finally, the reflective layer 54 may be gold having a thickness of about 500–1000 angstroms, preferably about 500 angstroms. Thus, the thickness of layers shown in FIGS. 4 and 5 are not to scale. In one embodiment, the combined thickness of the metal film 16 is less than about 1500 angstroms. Chromium is typically in tension, so if chromium were to be used as the adhesion layer 50, then a material that is in compression (such as tungsten) may be desired to be used as the corrective layer 52.

As noted above, it may be desired to maintain the reflective layer 54 as thin as possible while still maintaining the desired reflectivity. Accordingly, in one embodiment, it may be desired to have a reflective layer 54 with a thickness of at least about 500 angstroms and less than about 1000 angstroms, which may provide the desired reflectivity and enable a relatively thin metal film 16 to be formed. Furthermore, the diffusion blocking qualities of the diffusion barrier enable a relatively thin layer of the reflective layer 54 to located thereon, while still maintaining sufficient reflectivity.

The reflective layer 54 may have a reflectivity of at least about 95% at 1550 nanometers after annealing. The mirror deformation (dimension B of FIGS. 4 and 5) may be able to be maintained between about −500 angstroms and about +500 angstroms over a temperature range of about 20° C. to about 85° C., preferably between about −300 angstroms and about +300 angstroms. The radius of curvature of the mirror 12 may be able to remain greater than about 510 mm over a desired temperature range such as between about 20° C. and about 85° C. (see FIG. 7).

In one embodiment, in order to form the mirror structure 10, the upper wafer 20 may be a silicon-on-insulator wafer having an active layer thickness of about 10 microns (that is, the upper layer 36 may be about 10 microns thick). In one embodiment, the upper wafer 20 may be formed from two separate wafers (i.e. a first wafer and a second wafer, both of which may be silicon-on-insulator wafers) that are joined together. In this embodiment, the first wafer may include the upper layer 36 and the second wafer may include the lower layer 32. If desired, the upper silicon layer of the first wafer (i.e. the upper layer 36) may be etched, such as by reactive ion etching or deep reactive ion etching, to form the mirror pattern (i.e. defining the cut outs 22, 24 and the substrates 18 in the upper layer 36). An oxide layer (i.e. oxide layer 34) may then be grown on the upper silicon layer (32) of the second wafer.

The upper silicon layer of the first wafer (layer 36) may then be coupled to the grown oxide layer (34) on the second wafer. The lower silicon layer and embedded oxide layer of the second wafer may then be removed, such as by a wet etch, and portions of the silicon layer 32 (i.e. at area 31 of FIG. 3) may then be removed (i.e. at area 31 of FIG. 3) to expose the lower surface of the substrates 18. Next, the lower silicon layer and embedded oxide of the first wafer are removed to expose the upper sides of the substrates, thereby releasing the substrates 18. Finally, the adhesion layer 50 is then located on each substrate 18, the corrective layer 52 is located on top of the adhesion layer 50, and finally the reflective layer 54 is located on the corrective layer 52. Each of the adhesion layer 50, corrective layer 52, and reflective layer 54 may be deposited by any desired manner, such as by sputtering.

Once all of the layers 50, 52, 54 of the metal film 16 have been deposited onto the substrate 18, the resultant structure is baked or annealed. The annealing process may be carried out at any desired temperatures and times to provide the desired annealing benefits, such as temperatures of about 200° C.–400° C. and/or times of at least about 10 minutes up to several days. For example, in one embodiment, the structure is baked at about 250° C. for about ½ hour. The resultant mirror array 14 formed on the upper wafer 20 is then coupled to a lower wafer 44 by any desired manner, such as by frit bonding. Alternately, the substrates 18 are first formed, the upper wafer 20 is coupled to the lower wafer 44, and the metal film 16 is then deposited on the substrates 18.

After the substrates 18 are formed or released, the substrates 18 are typically found to be bowed in convex due to a thin upper stressed layer induced from RIE damage on the substrate 18. In particular, the substrate 18 may have an upper oxide and a lower oxide located thereon. The upper oxide may been removed by one etching process (such as a wet etch) and the lower oxide may have been removed by another etching process (such as a dry etch). The use of different etching methods on different sides of the substrate 18 may induce stresses, and therefore bowing, in the substrate 18. Thus, the film 16 of the present invention may be used to compensate for such bowing.

The film 16 need not include all three layers 50, 52, 54 shown in FIGS. 4 and 5, or may include additional layers. For example, if desired, the corrective layer 52 may not used if the mirror is sufficiently flat or flatness is not an important design parameter. Alternately, the adhesion layer 50 may be omitted if the corrective layer 52 and/or reflective layer 54 can bond in a sufficient manner to the substrate 18. Furthermore, both the adhesion 50 and corrective layers 52 may not be used, and in this case a stand-alone diffusion barrier may be located between the reflective layer 52 and the substrate 18.

As noted above, the corrective layer 52 may provide two benefits: tensile corrective forces and diffusion blocking properties. However, if desired, two different layers, each of which provides one of the two benefits, may be used in place of the single corrective layer 52. In this case, one of the layers may be nearly any material which is in tension (or compression, if desired) such as chrome, a nickle-chrome alloy, INVAR® (a titanium/tungsten/chrome alloy), and the other layer may be made of any diffusion blocking material (such as tungsten). In this case, the separate diffusion blocking layer may be used in combination with any of the reflective layer 54, adhesive layer 50, and tensile layer (or compression layer), and the separate tensile layer (or compression layer) may be used in combination with any of the reflective layer 54, adhesive layer 50, and diffusion blocking layer. Thus, it can be seen that the various layers other than the film 16 can be included, omitted and arranged as necessary to meet the desired objectives.

Having described the invention in detail and by reference to the preferred embodiments, it will be apparent that modifications and variations thereof are possible without departing from the scope of the invention.

What is claimed is:

1. A micro mirror structure including a plurality of individually movable mirrors arranged in an array, each mirror having a generally concave shape at a temperature of about 20 degrees Celsius and having a generally convex shape at a temperature of about 85 degrees Celsius wherein said plurality of mirrors are arranged in an array and each mirror includes a substrate, a top reflective layer located above said substrate, a first layer located between said substrate and said reflective layer and a second layer located between said substrate and said first layer.

2. The micro mirror structure of claim 1 wherein each minor transitions from a generally concave shape to a generally convex shape at a temperature of between about 45 and about 65 degrees Celsius.

3. The micro mirror structure of claim 1 wherein said substrate is a semiconducting material and said reflective layer is a metal.

4. The micro mirror structure of claim 1 wherein said first layer is a diffusion barrier layer.

5. The micro mirror structure of claim 1 wherein said first layer is in a state of tension and said second layer can be coupled well to semiconductors.

6. The micro mirror structure of claim 1 wherein said first layer is selected from the group consisting of nickel, nickel-chromium, tungsten and tantalum, said second layer is selected from the group consisting of titanium and chromium, and wherein said reflective layer is selected from the group consisting of gold, silver and aluminum.

7. The micro mirror structure of claim 1 wherein said first layer is in a state of tension or compression opposite to the state of tension or compression of the second layer.

8. The micro mirror structure of claim 1 wherein said reflective layer has a thickness of about 500 angstroms or less.

9. The micro mirror structure of claim 1 wherein said reflective layer has a reflectivity of at least about 95%.

10. The micro mirror structure of claim 1 wherein each mirror is pivotably coupled to a support.

11. The micro mirror structure of claim 10 comprising control electronics which can control the pivoting movement of each mirror.

12. The micro minor structure of claim 1 wherein said first layer is a corrective layer which provides stress balancing to said mirrors and wherein said second layer is an adhesion layer.

13. The micro mirror structure of claim 1 wherein said first layer is a diffusion barrier layer and said second layer is an adhesion layer.

14. The micro mirror structure of claim 1 wherein said first layer is both a diffusion barrier layer and a corrective layer which provides stress balancing to said mirrors, and wherein said second layer is an adhesion layer.

15. A micro mirror structure comprising a plurality of individually movable mirrors arranged in an array, each mirror having;

a substrate;

a top reflective layer;

a first layer located between said substrate and said too reflective layer, said first layer being a corrective layer an a state of tension; and a second layer located between said substrate arid said reflective layer, wherein each mirror has a generally concave shape at a temperature of about 20 degrees Celsius and has a generally convex shape at a temperature of about 85 degrees Celsius.

16. A micro mirror structure comprising a plurality of individually movable mirrors arranged in an array, each mirror including;

a substrate;

a top reflective layer;

a first layer located between said substrate and said top reflective layer, said first layer being a diffusion barrier that generally limits the diffusion of said top reflective layer through said diffusion barrier layer at elevated temperatures; and a second layer located between said substrate and said top reflective layer wherein each mirror has a generally concave shape at a temperature of about 20 degrees Celsius and has a generally convex shape at a temperature of about 85 degrees Celsius.

17. A micro mirror structure comprising a support including plurality of individually movable mirrors arranged in an array, wherein each mirror has a radius of curvature greater than about 500 mm over the entire range of temperatures from about 20 degrees Celsius to about 85 degrees Celsius and wherein each mirror includes a substrate, a top reflective layer located above said substrate, a first layer located between said substrate and said reflective layer and a second layer located between said substrate and said first layer.

* * * * *

UNITED STATES PATENT AND TRADEMARK OFFICE
CERTIFICATE OF CORRECTION

PATENT NO. : 6,778,315 B2
DATED : August 17, 2004
INVENTOR(S) : Shuwen Guo and Ross Hoffman It is certified that error appears in the above-identified patent and that said Letters Patent is hereby corrected as shown below:

Column 8,
Line 67, "minor" should read -- mirror --;

Column 10,
Line 6, "too" should read -- top --;
Line 8, "an" should read -- in --;
Line 9, "arid" should read -- and --.

Signed and Sealed this

Fifteenth Day of February, 2005

JON W. DUDAS
*Director of the United States Patent and Trademark Office*